United States Patent [19]
Wellheuser

[11] Patent Number: 5,276,364
[45] Date of Patent: Jan. 4, 1994

[54] BICMOS BUS INTERFACE OUTPUT DRIVER COMPATIBLE WITH A MIXED VOLTAGE SYSTEM ENVIRONMENT

[75] Inventor: Christopher M. Wellheuser, Sherman, Tex.

[73] Assignee: Texas Instruments Incorporated, Dallas, Tex.

[21] Appl. No.: 808,253

[22] Filed: Dec. 13, 1991

[51] Int. Cl.[5] .................... H03K 19/092; H03K 17/16
[52] U.S. Cl. ..................................... 307/475; 307/443; 307/473
[58] Field of Search ................. 307/475, 443, 456, 473

[56] References Cited
U.S. PATENT DOCUMENTS

| | | | |
|---|---|---|---|
| 4,064,405 | 12/1977 | Cricchi et al. | 307/475 |
| 4,897,564 | 1/1990 | Chen | 307/475 |
| 4,988,899 | 1/1991 | Jansson | 307/473 |
| 5,004,936 | 4/1991 | Anderson | 307/443 |
| 5,034,632 | 7/1991 | Jansson et al. | 307/475 |
| 5,047,672 | 9/1991 | Bhuva et al. | 307/475 |
| 5,097,153 | 3/1992 | Mahler et al. | 307/475 |
| 5,124,574 | 6/1992 | Ibaraki | 307/475 |

Primary Examiner—Edward P. Westin
Assistant Examiner—Richard Roseen
Attorney, Agent, or Firm—Richard L. Douglas; Wade J. Brady

[57] ABSTRACT

A low voltage BiCMOS output driver that is operable in a mixed voltage signal environment is provided which comprises a pull-up transistor and blocking circuitry operable to block current flow from the mixed voltage signal environment through the BiCMOS output driver to its supply voltage source.

18 Claims, 3 Drawing Sheets

5,276,364

BICMOS BUS INTERFACE OUTPUT DRIVER COMPATIBLE WITH A MIXED VOLTAGE SYSTEM ENVIRONMENT

TECHNICAL FIELD OF THE INVENTION

This invention relates generally to the field of electronic devices, and more particularly to a BiCMOS bus interface output driver compatible with a mixed voltage system environment.

BACKGROUND OF THE INVENTION

Although digital electronics circuits have proved useful in an extremely wide range of applications, demands for faster and lower power circuits remain significant. The combination of bipolar and CMOS technologies in BiCMOS integrated circuits has allowed for relatively high speed performance and lower power consumption. Even greater power reductions have been accomplished through the use of low voltage technology, whereby power supplies on the order of 3.3 volts are used rather than power supplies on the order of 5 volts.

While low voltage technology systems have incorporated BiCMOS technologies to allow for relatively high speed performance, most existing systems are 5 volt systems. Unfortunately, difficulties arise when low voltage technology systems are to be integrated with 5 volt systems. One of those difficulties arises from the fact that low voltage technology systems, even in tri-state operation, act as current sinks when 5 volt systems are in their high (i.e., approximately 5 volt) state. Although some pure CMOS devices have blocked current sinking in unmixed voltage systems (see, e.g., U.S. Pat. No. 5,004,936 for a "NON-LOADING OUTPUT DRIVER CIRCUIT", issued to Andresen), the problems associated with the interfacing of low voltage technology systems with mixed voltage environments have not been addressed.

Therefore, a need has arisen for a low voltage technology output driver that can be coupled to mixed voltage systems (such as systems containing 5 volt and 3.3 volt systems) without sinking current from the higher voltage devices, even while the output driver is powered down, while yet providing enhanced speed and power performance.

SUMMARY OF THE INVENTION

A low voltage technology BiCMOS output driver is provided comprising a BiCMOS buffer stage, a pull-up transistor, and blocking circuitry coupled to the pull-up transistor and the BiCMOS buffer stage and operable to block current flow from a mixed voltage signal environment to which the BiCMOS output driver is coupled.

In one embodiment of the present invention, the blocking circuitry comprises a blocking diode that is able to block current flow from the mixed voltage signal environment through the substrate of the pull-up transistor. Furthermore, the blocking circuitry also comprises two clamping transistors operable to clamp voltages from the mixed voltage signal environment to the gate of the pull-up transistor, thereby preventing the pull-up transistor from turning on and sinking current to a supply voltage source powering the BiCMOS output driver. Finally, another blocking diode prevents current from sinking through the BiCMOS buffer stage to the supply voltage source.

An important technical advantage of the present invention inheres in the fact that the BiCMOS output driver of the present invention is operable in a mixed voltage system environment. Thus, the power savings of low voltage technology BiCMOS circuitry can be interfaced with many existing higher voltage systems, such as 5 volt signal systems. The low voltage technology BiCMOS output driver of the present invention is able to interface with higher voltage systems because it does not sink current from the higher voltage systems to its lower supply voltage source.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1 through 6 of the drawings, like numerals being used for like and corresponding parts of the various drawings.

Figure 1:
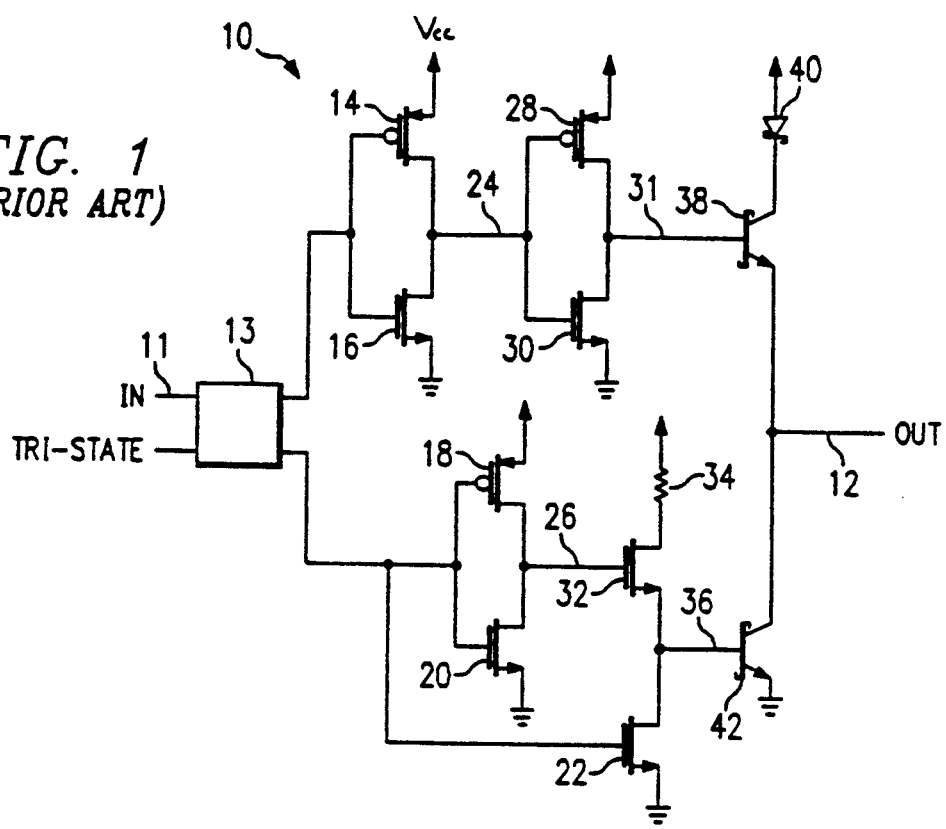
FIG. 1 is a schematic circuit diagram of a prior art low voltage technology output driver.

FIG. 1 is a schematic circuit diagram of a prior art BiCMOS output driver 10. Inputs on an input line 11 to an output driver 10 are outputted to an output line 12 which is coupled to a bus interface to which other mixed voltage signal systems are also coupled. The purpose of output driver 10 is to provide output signals satisfying predetermined voltage and current specifications for the system in which the driver is to be used. For example, for a 3.3 volt system (i.e., $V_{cc}=3.3$ volts), a "high" output may require a minimum of 2.4 volts at an output current of $-16$ milliamps, or a minimum output voltage of 2 volts at $-40$ milliamps of output current.

In buffer operation of the circuit of FIG. 1, an input on line 11 is output on two (upper and lower) outputs of a logic unit 13 (to be discussed). The upper signal is coupled to the first stage of two CMOS inverters. The first CMOS inverter comprises transistors 14 and 16, and the second CMOS inverter comprises transistors 28 and 30. The sources of transistors 14 and 28 are connected to a supply voltage source, $V_{cc}$, and their drains are connected to the drains of transistors 16 and 30, respectively. The sources of transistors 16 and 30 are connected to ground. Furthermore, the drains of transistors 14 and 16 are commonly coupled at a node 24 to the gates of transistors 28 and 30, and the drains of transistors 28 and 30 are coupled to a node 31. As for the lower half of output driver 10, the input signal is connected to the gates of transistors 18, 20, and 22. The sources of transistors 20 and 22 are connected to ground and the source of transistor 18 is connected to $V_{cc}$. The gates of transistors 18 and 20 are commonly coupled, as are their drains. Furthermore, the drains of transistors 18 and 20 are coupled at a node 26 to the gate of transistor 32. The source of transistor 32 is coupled to the drain of transistor 22 and to a node 36. The drain of transistor 32 is coupled through a resistor 34 to $V_{cc}$.

The circuitry thus described with regard to output driver 10 comprise the CMOS portions of the output driver. Each of the upper and lower CMOS portions drives a bipolar transistor, with the upper half driving a bipolar transistor 38, and the lower half driving a bipolar transistor 42. The base of transistor 38 is coupled to node 31. The collector of transistor 38 is connected to $V_{cc}$ through a diode 40. The base of transistor 42 is connected to node 36, and its collector is connected to the emitter of transistor 38. Furthermore, the emitter of transistor 42 is connected to ground. The collector of transistor 42 and the emitter of transistor 38 are coupled to the output signal 12, which is coupled to the bus interface for a mixed voltage signal environment. The CMOS portions of output driver 10, in connection with bipolar transistors 38 and 42, comprise a BiCMOS output buffer.

Transistors 38 and 42 may comprise Schottky bipolar transistors, and diode 40 may comprise a Schottky diode. Furthermore, transistors 14, 18, and 28 may comprise p-channel field effect transistors, and transistors 16, 20, 22, 30, and 32 may comprise n-channel field effect transistors. Of course, it will be understood that other types and combinations of CMOS and bipolar transistors may be used in the various embodiments of the inventions to be subsequently described.

A problem that arises with the output driver 10 described in FIG. 1 is that its high output voltage may be too low to be recognized as a "true" high output. In FIG. 1, in a high output voltage state, the voltage at output line 12 will be approximately equal to $V_{cc}$ minus the voltage drop across the base-emitter junction of transistor 38. This is true since transistor 28 will be on, thereby coupling $V_{cc}$ to the base of transistor 38. In cold temperature operation, the voltage drop across transistor 38's base-emitter junction may be so high that the voltage appearing on output line 12 is too low to be considered a "true high". For example, if a 3.3 volt system were used, at worst case, $V_{cc}$ would equal 3 volts. If the voltage drop across the base emitter junction of transistor 38 is greater than 1 volt, then the output voltage at output signal 12 will be less than 2 volts, which is less than a typical "true high".

Figure 2:
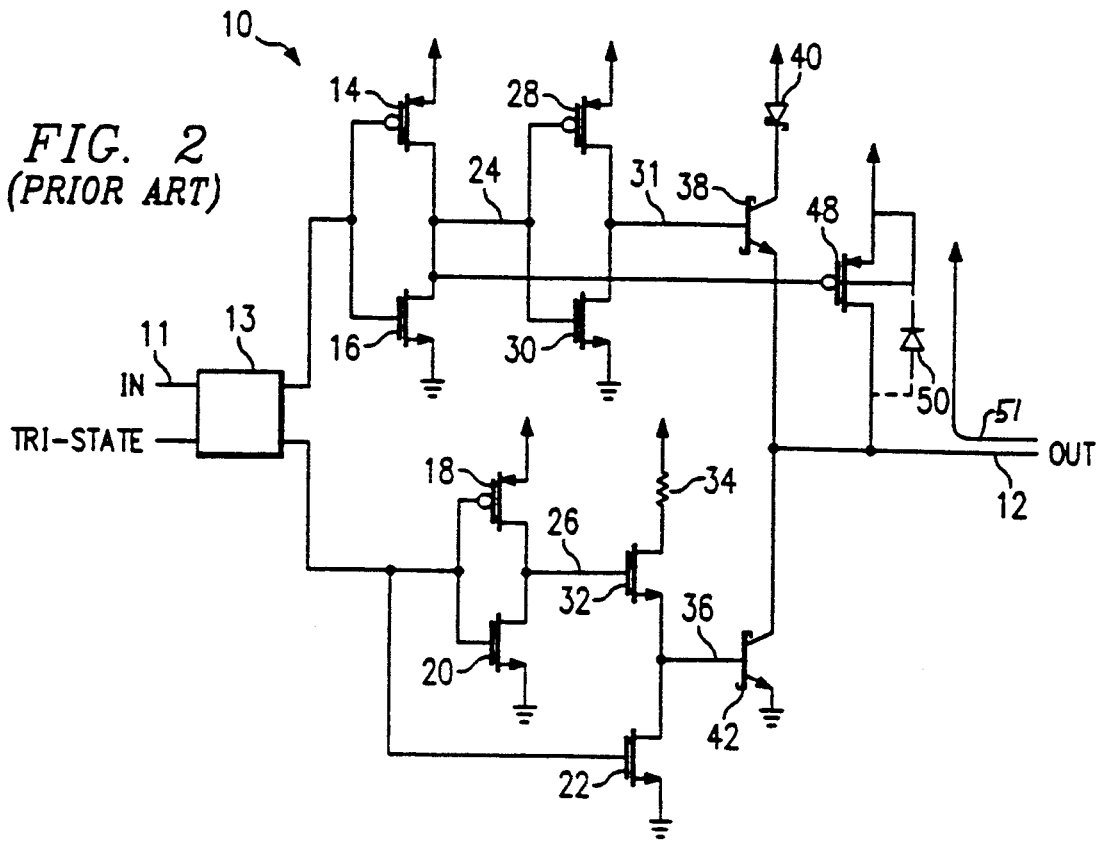
FIG. 2 is a schematic circuit diagram of a prior art low voltage technology output driver with a pull-up transistor.

To alleviate the problem discussed above, a typical solution in the prior art has been to add a pull-up transistor 48 as shown in FIG. 2. Referring to FIG. 2, where like numerals designate like and corresponding elements of FIG. 1, the gate of transistor 48 is coupled to node 24, its source is coupled to $V_{cc}$, and its drain is coupled to output signal 12. Furthermore, the substrate of transistor 48 is coupled to $V_{cc}$. Thus, in the case described above, output signal 12 will be coupled to $V_{cc}$ through transistor 48 for a true "high output" signal.

In addition to performing output-buffer functions, output driver 10 can be placed in the tri-state mode, by use of a tri-state enable. When the tri-state enable is not active, then logic unit 13 simply passes the input signal on input line 11 through to both of its outputs as shown in FIG. 1. However, when tri-state enable is active, then the outputs of logic unit 13 are set to turn off both the upper and lower portions of output driver 10. For example, a low voltage, such as 0 volts, will be placed on the gates of transistors 14 and 16, while a high voltage such as 3.3 volts will e placed on the gates of transistors 18, 20, and 22. Thus, transistors 38 and 42 will both be off, providing a high impedance output state for output driver 10.

Since output driver 10 will be interfaced with a mixed voltage signal environment, tri-state operation is extremely important. When output driver 10 is to be inactive, thus allowing other systems to drive the interface bus to which output 12 is coupled, it is crucial that a true high impedance state is achieved. When the supply voltage source for output driver 10 is powered down, it is also necessary that output driver 10 not sink current to the supply voltage source.

Figure 3:
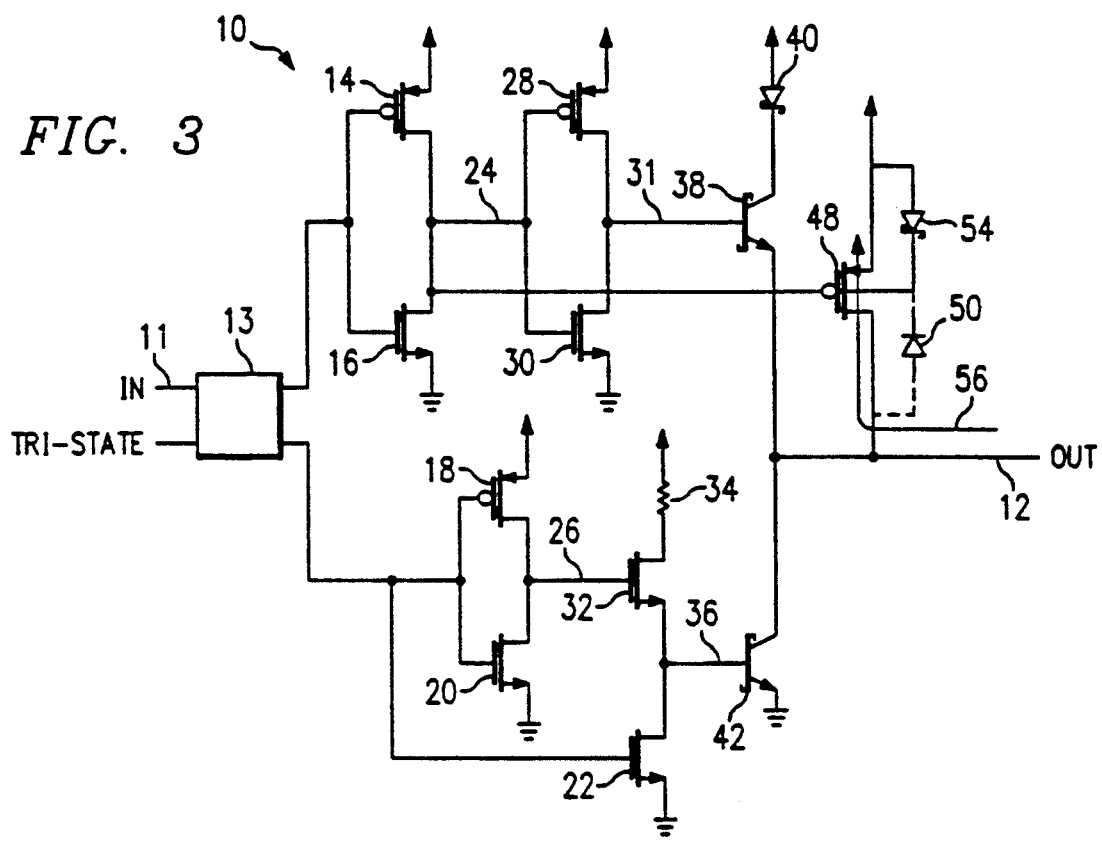
FIG. 3 is a schematic circuit diagram of a low voltage technology output driver constructed in accordance with the present invention with a pull-up transistor and blocking diode.

A problem arises, however, in tri-state operation of the circuit of FIG. 2, since pull-up transistor 48 is a p-channel device. Consequently, a p-n junction, i.e., a diode, is formed between the drain of transistor 48 and its substrate, indicated by dashed line 50. Thus, current can flow from output signal 12 to $V_{cc}$ if output signal 12 is greater than $V_{cc}$, indicated by line 51 in FIG. 2. Such Will be the case when, for example, $V_{cc}$ equals 3.3 volts and the voltage on output signal 12 is driven to 5 volts by the mixed environment to which output signal 12 is connected. This causes current to flow through the substrate of transistor 48 to $V_{cc}$. FIG. 3 illustrates circuitry which eliminates such problems in the tri-state operation of a BiCMOS output driver. In this circuit, a blocking diode 54 is connected between $V_{cc}$ and the substrate of transistor 48. Diode 54 serves to block current flow between output signal 12 and $V_{cc}$. However, with this circuit, pull-up transistor 48 may still present a current sinking problem. If the voltage on output signal 12 is greater than the voltage on the gate of transistor 48 by more than that transistor's threshold voltage, current will flow from the output signal 12 to $V_{cc}$ (from transistor 48's drain to source), indicated by line 56. The typical threshold voltage for a transistor such as transistor 48 is approximately $-1$ volt ($V_{cc}$), and thus can be exceeded, for example, if an external system connected to output signal 12 drives that signal to 5.5 volts while the gate of transistor 48 is at 3.0 volts. (For 3.3 volt systems, high voltages may drop to 3.0 volts, and for 5 volt systems, high voltages may rise to 5.5 volts.)

Figure 4:
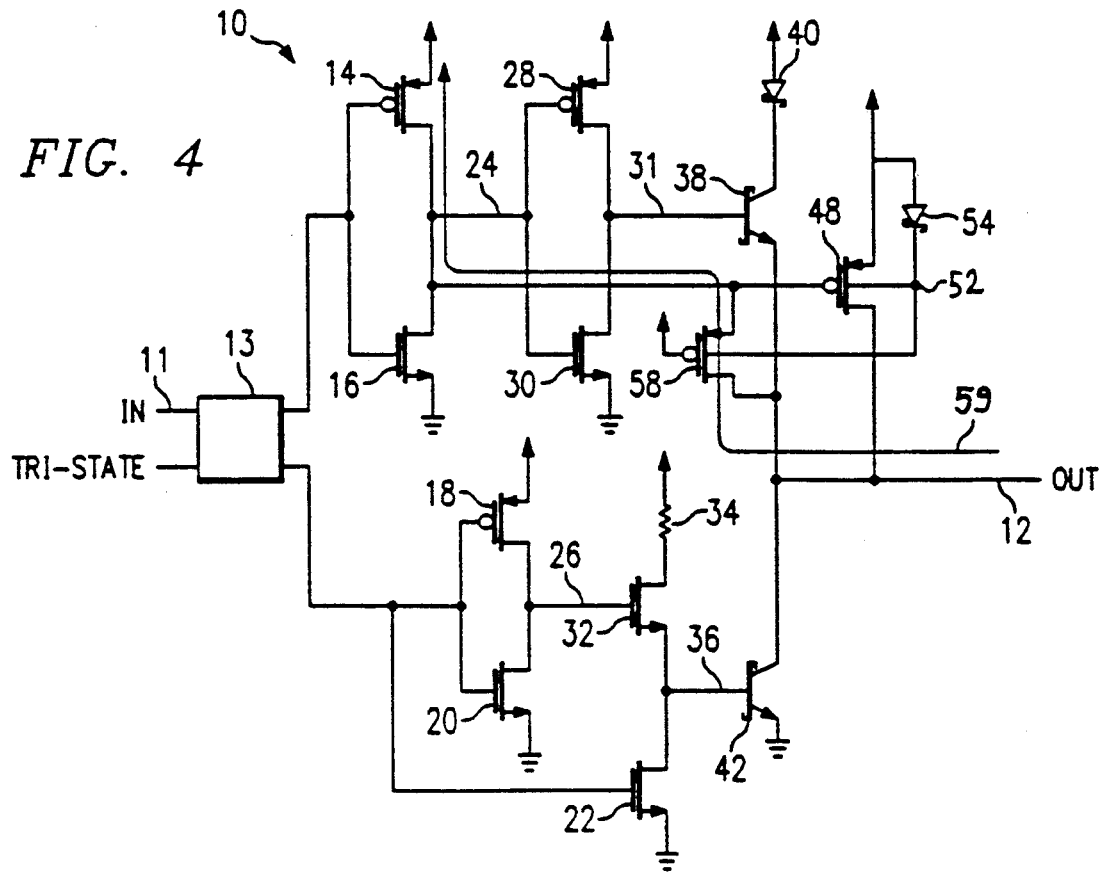
FIG. 4 is a schematic circuit diagram of another embodiment of a low voltage technology output driver with a pull-up transistor, a blocking diode, and a clamping transistor.

FIG. 4 illustrates a circuit which maintains transistor 48 off in tri-state conditions. A clamping transistor 58 is connected such that its source is connected to the gate of transistor 48, its drain is connected to output signal 12, and its gate is connected to $V_{cc}$. Furthermore, its substrate is connected to the cathode of diode 54 (node 52).

Clamping transistor 58 serves to couple the output signal 12 to the gate of pull-up transistor 48 whenever the voltage on output signal 12 is greater than $V_{cc}$ (the gate voltage on clamping transistor 58) by more than the threshold voltage of that transistor. As a result, the voltage on the gate of transistor 48 will equal the voltage on its drain (the voltage on output signal 12) and the threshold voltage of transistor 48 will not be exceeded, and no current will flow from output signal 12 through transistor 48 to $V_{cc}$.

The inclusion of transistor 58, however, may introduce another current sinking disadvantage. When the voltage on output signal 12 is greater than $V_{cc}$ by more than the threshold voltage of transistor 58, current will flow from the drain of transistor 58 through its source to node 24 and through transistor 14, as shown by current flow line 59. Since the substrate of transistor 58 is coupled to the cathode of diode 54, current will not sink through the drain-substrate junction of transistor 58.

Figure 5:
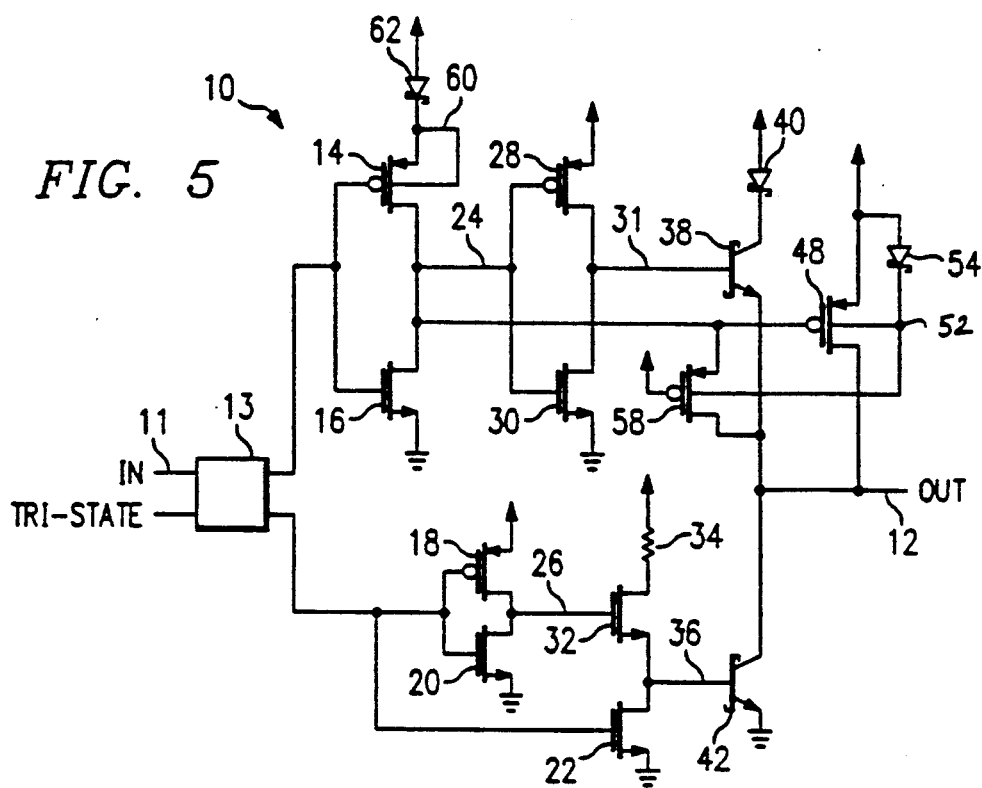
FIG. 5 is a schematic circuit diagram of a third embodiment of a low voltage technology output driver with a pull-up transistor, two blocking diodes, and a clamping transistor.

FIG. 5 illustrates a circuit which eliminates this problem. Blocking diode 62, as shown in FIG. 5, is connected with its cathode coupled to the source of transistor 14 and its anode connected to $V_{cc}$. Connecting diode 62 in this way also blocks current flow between the p-n junction formed between the drain of transistor 14 and its substrate, which is connected to transistor 14's source (node 60).

The circuit shown in FIG. 5 operates to block current flow from output signal 12 to $V_{cc}$ when the external system coupled to output signal 12 drives it high, such as to 5.5 volts. However, the voltage drop across diode 62 ($V_f$) will cause the voltage at node 24 in the tri-state situation to be $V_{cc}-V_f$. As a result, the gate voltage on transistor 48 will likewise be equal to $V_{cc}-V_f$ in the tri-state condition. Thus, when the output signal voltage is driven by the external environment to a high voltage, the threshold voltage of transistor 48 will be exceeded before the threshold voltage of transistor 58 will be, since the gate of transistor 58 is connected directly to $V_{cc}$ while the gate of transistor 48 is at a voltage of $V_{cc}-V_f$. Consequently, current will sink through transistor 48 until the voltage on output signal 12 rises to a level sufficient to exceed the threshold voltage of clamping transistor 58, thereby clamping the gate of transistor 48 to the voltage of output signal 12.

Figure 6:
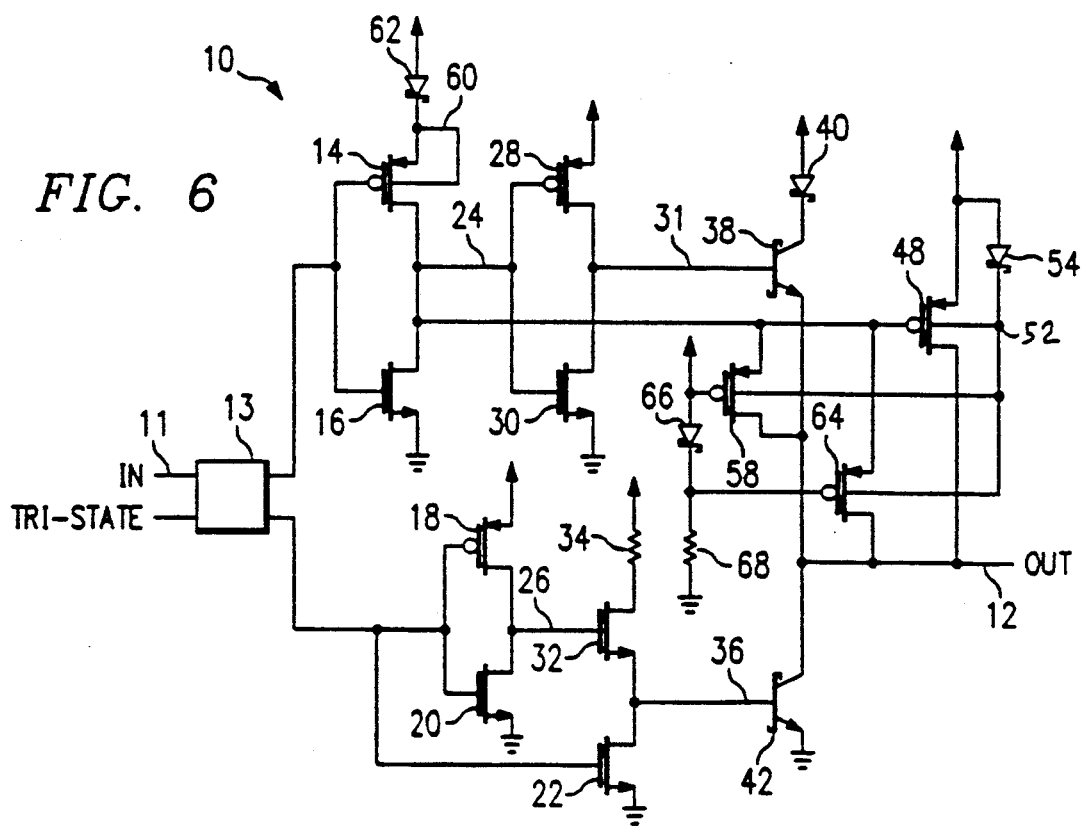
FIG. 6 is a schematic circuit diagram of a fourth embodiment of a low voltage technology output driver with a pull-up transistor, two blocking diodes, and two clamping transistors.

FIG. 6 illustrates the preferred embodiment of the present invention, wherein circuitry insures that the gate of transistor 48 is clamped to the voltage on output signal 12 before transistor 48 begins to sink current. A clamping transistor 64, a biasing diode 66, and a biasing resistor 68, as shown in FIG. 6, are included in output driver 10 to provide this function. Resistor 68 may have a resistance of, for example, 50 k$\Omega$.

The drain of transistor 64 is coupled to output signal 12, its source is coupled to the gate of transistor 48 (node 24), its substrate is connected to the cathode of blocking diode 54 (node 52), and its gate is connected to the cathode of biasing diode 66 (which can be a Schottky diode). The anode of biasing diode 66 is coupled to $V_{cc}$. The cathode of diode 66 is coupled to biasing resistor 68 and to the gate of clamping transistor 64. Biasing resistor 68 is coupled to the cathode of biasing diode 66 and to ground. Current sinking through transistor 64 is blocked by blocking diodes 54 and 62.

In operation, clamping transistor 64 clamps the gate of transistor 48, thereby keeping it from sinking current when the voltage on output signal 12 exceeds the gate voltage of transistor 64 by more than that transistor's threshold voltage. Since the gate of transistor 64 is connected to $V_{cc}$ through diode 66, it will clamp the voltage on output signal 12 to the gate of transistor 48 before transistor 48 begins to sink current.

In summary, an output driver 10 is provided which enables the interfacing of low voltage technology systems with mixed voltage signal environments, such as 5 volt systems. By clamping the gate of pull-up transistor 48 to output signal 12, current is prevented from sinking through pull-up transistor 48 to $V_{cc}$. Furthermore, blocking diodes 54 and 62 block other available current paths between output signal 12 and $V_{cc}$. It should also be understood that the blocking circuitry of the present invention will operate if $V_{cc}$ of output driver 10 is powered down, since blocking diodes 54 and 62 will continue to block current, and clamping transistors 58 and 64 will prevent current sinking through transistor 48 to the powered down voltage supply source.

Although the invention has been described in connection with a particular circuitry embodiment, it should be understood that the disclosure is for the purposes of teaching the present invention and should not be construed to limit the scope of the present invention, which is defined solely by the scope and spirit of the appended claims.

What is claimed is:

1. A low voltage output driver operating between a supply voltage source and ground, comprising:
   a BiCMOS buffer stage comprising an input and an output;
   a pull-up transistor coupled between said output, and said supply voltage source; said pull-up transistor comprising a p-channel field effect transistor; having a first substrate, a gate, a drain coupled to said output and a source coupled to said supply voltage source;
   a blocking diode having a first cathode coupled to said first substrate and a first anode coupled to said supply voltage source for blocking current flow form said output to said supply voltage source, such that said output driver is compatible with a mixed voltage signal environment.

2. The output driver of claim 1 wherein said first blocking diode comprises a Schottky diode.

3. The output driver of claim 1 wherein said blocking circuitry further comprises a first clamping transistor coupled to said pull-up transistor and said output and operable to clamp said output to said first gate.

4. The output driver of claim 3 wherein said first clamping transistor comprises a second substrate, a second gate, a second drain, and a second source, said second substrate being coupled to said first cathode, said second gate being coupled to said supply voltage source, said second drain coupled to said output, and said second source coupled to said first gate.

5. The output driver of claim 3 wherein said first clamping transistor comprises a p-channel field effect transistor.

6. The output driver of claim 3 wherein said blocking circuitry further comprises a second blocking diode comprising a second cathode and a second anode, said second cathode coupled to said buffer stage and said second anode coupled to said supply voltage source.

7. The output driver of claim 6 wherein said buffer stage comprises an upper CMOS inverter, said second diode coupled between said upper CMOS inverter and said supply voltage source.

8. The output driver of claim 6, wherein said second blocking diode comprises a Schottky diode.

9. The output driver of claim 6, wherein said blocking circuitry further comprises a second clamping transistor coupled to said pull-up transistor and said output, and operable to clamp said output to said first gate at a lower output voltage than said first clamping transistor.

10. The output driver of claim 9, wherein said blocking circuitry further comprises:

a biasing diode comprising a third cathode and a third anode, said third anode coupled to said supply voltage source;

said second clamping transistor comprises a third substrate, a third gate, a third source, and a third drain, said third substrate coupled to said first cathode, said third gate coupled to said third cathode, said third source coupled to said first gate, and said third drain coupled to said output; and a first biasing resistor coupled to said ground and said third cathode.

11. The output driver of claim 10 wherein said second clamping transistor comprises a p-channel field effect transistor.

12. The output driver of claim 10 wherein said biasing diode comprises a Schottky diode.

13. A low voltage output driver operating between a supply voltage source and ground, comprising:

a buffer stage comprising an input and an output;

a pull-up transistor coupled to said output and including a first substrate, gate, drain and source;

a first blocking diode coupled between said supply voltage source and said first substrate;

a second blocking diode coupled between said supply voltage source and said buffer stage;

a first clamping transistor coupled to said pull-up transistor and said output, and operable to clamp said first gate to said output; and a second clamping transistor coupled to said pull-up transistor and said output, and operable to clamp said first gate to said output at a lower output voltage than said first clamping transistor, such that said output driver is compatible with a mixed voltage signal environment.

14. A method of interfacing a low voltage output driver to a mixed voltage signal environment, comprising the steps of:

receiving input signals;

buffering the input signals to generate output signals at predetermined voltage levels;

providing a tri-state output for the output driver; and blocking sinking of current from the mixed voltage environment through the output driver to a voltage supply source.

15. The method of claim 14 wherein a pull-up transistor is coupled to the tri-state output, said step of blocking comprising blocking current flow from the mixed voltage signal environment through the substrate of the pull-up transistor.

16. The method of claim 15 wherein said step of blocking further comprises clamping the gate of the pull-up transistor to the tri-state output.

17. The method of claim 16 wherein a first clamping transistor is coupled to the pull-up transistor, said step of blocking further comprising stopping current from the tri-state output sinking through the clamping transistor.

18. The method of claim 17 and further comprising the step of clamping the gate of the pull-up transistor to the tri-state output through a second clamping transistor.

* * * * *

UNITED STATES PATENT AND TRADEMARK OFFICE
CERTIFICATE OF CORRECTION

PATENT NO. : 5,276,364
DATED     : January 4, 1994
INVENTOR(S) : Christopher M. Wellheuser It is certified that error appears in the above-indentified patent and that said Letters Patent is hereby corrected as shown below:

Title page, col. 2, at "Attorney, Agent, or firm", delete "Douglas" and insert --Donaldson--.

Signed and Sealed this

Nineteenth Day of July, 1994

Attest:

BRUCE LEHMAN

*Attesting Officer*        *Commissioner of Patents and Trademarks*